United States Patent [19]

Noma et al.

[11] Patent Number: 4,854,264
[45] Date of Patent: Aug. 8, 1989

[54] VACUUM EVAPORATING APPARATUS

[75] Inventors: Hiroshi Noma, Yaizu; Hiroshi Fujiyasu, Hamamatsu, both of Japan

[73] Assignee: Fuji Seiki Inc., Kanagawa, Japan

[21] Appl. No.: 131,009

[22] Filed: Dec. 10, 1987

[30] Foreign Application Priority Data

Dec. 10, 1986 [JP] Japan .................................. 61-294510
Mar. 6, 1987 [JP] Japan .................................. 62-51605

[51] Int. Cl.[4] ............................................. C23C 14/00
[52] U.S. Cl. ................................. 118/719; 118/725; 118/726; 118/730; 114/221
[58] Field of Search ............... 118/725, 726, 719, 730; 414/221

[56] References Cited

U.S. PATENT DOCUMENTS

| | | | |
|---|---|---|---|
| 3,925,146 | 12/1975 | Olsen | 118/726 |
| 4,286,545 | 9/1981 | Takagi | 118/726 |
| 4,482,799 | 11/1984 | Pricenski | 118/726 |
| 4,542,712 | 9/1985 | Sato | 118/726 |
| 4,543,467 | 9/1985 | Eisele | 118/726 |
| 4,668,480 | 5/1987 | Fujiyashu | 118/726 |
| 4,681,773 | 7/1987 | Bean | 118/719 |

*Primary Examiner*—Richard Bueker
*Attorney, Agent, or Firm*—Wenderoth, Lind & Ponack

[57] ABSTRACT

An vacuum evaporating apparatus for depositing thin films on a substrate comprises a vacuum tank, a hot-wall furnace for heating and evaporating a material to be evaporated, an auxiliary vacuuming means connected to the vacuum tank through a gate valve, a substrate exchanging mechanism for an evaporated substrate with a new substrate through the auxiliary vacuuming device, and a substrate transferring unit generally of a turn table located to be rotatable above the hot-wall furnace. The hot-wall furnaces are disposed in standing state in the vacuum tank, each of hot-wall furnaces being provided with a plurality of crucibles coaxial in a vertical direction in which the evaporation source materials are accommodated, heaters independently provided for the respective crucibles, and thermocouples connected to the respective heaters to independently control the temperatures of the respective crucibles. The thermocouples are operatively connected to socket pins, at the bottom of the hot-wall furnace, and are made of the same material as those constituting metal portions of the respective thermocouples.

4 Claims, 6 Drawing Sheets

VACUUM EVAPORATING APPARATUS

BACKGROUND OF THE INVENTION

This invention concerns with a vacuum evaporating apparatus for making thin films, particularly with a vacuum tube type furnace with electrode pins for heating wire and thermocouples.

In these days it has been increasingly requirement to make thin films of a metal, semiconductor, superconductor and the like on a substrate, not only in the electronics field but also in various other fields. For electronics in order to obtain high quality films molecular beam epitaxy (MBE) is one of the powerful methods using vacuum evaporating system. Even synthetic materials such as superlattices can be made by using atomic scale growth control.

Concerning depositing gas, elements or molecules evaporated from the source materials are widely used in a standard vacuum evaporating method. As a result of much progress in the chemical vapour deposition (CVD) method, metalorganic gas has been recently increasingly used for the vacuum evaporating method also, resulting in metal-organic molecular beam epitaxy (MOMBE). For this epitaxy the metal organic molecules should be cracked to be metal molecules and organic molecules before reaching the substrate. Thus, for example, a heated chamber to provide the metal organic molecule with sufficient energy for these molecule to be cracked, must be supplied in the system.

Hot wall epitaxy is a kind of MBE. Crystal film of III-V compound, an excellent infrared semiconductor laser device consisting of IV-VI compounds and II-VI compound semiconductor superlattices have been produced by means of this epitaxy. This hot-wall epitaxy is described in U.S. Pat. 4,662,981.

The epitaxial film growth is always carried out using a heated chamber (furnace) which contains some crucibles for source materials. The evaporated gas from the crucibles flows out to a substrate through the space surrounded by a hot wall. Photons from the hot wall, which is just below the substrate, radiate the growing film surface and make it possible to grow high quality films on the substrate because of giving energy and momentum to the surface atoms, and especially to the loosely bound unstable atoms on the substrate.

A part of the depositing gas flows out through a small gap in between the substrate holding plate and the open top of the hot wall tube. This blocks introduction of residual gas molecules such as $O_2$ to the growing film surface, but sometimes induces such troubles as electrical shorts, the breaking of the heating wire, or contamination on the outer part of the hot wall furnace.

The aforementioned prior art hot wall epitaxy is carried out in a conventional technique by using a "hot-wall furnace" located in a vacuum evaporating apparatus as shown in FIG. 6.

Referring to FIG. 6, a prior art "hot-wall furnace" essentially consisting of a heating means 2 comprises a silica glass tube provided with a first recess 3 for holding a first material as a source to be evaporated, called an evaporation source material hereinafter, and a second recess 4 disposed coaxially below the first recess 3 for holding a second evaporation source material. There are also first and second heaters 5 and 6 located around the first and second recesses 3 and 4, respectively independently to control the temperatures of the corresponding recesses 3 and 4, and first and second thermocouples 7 and 8 for the respective heaters 5 and 6.

Within the heating means 2 is disposed a crucible vessel 11 provided with first and second crucibles 9 and 10 for accommodating the first and second evaporation source materials, respectively, as shown in FIG. 7, to form a thin film made of more than one kind of metal, non-metals or compounds on the substrate disposed above the heating furnace. The upper part of the crucible 9 acts as a hot wall.

With the conventional heating means 2 having the construction described above, the crucible vessel 11 can be easily exchanged, but the exchange of the heating means 2 in case of contamination thereof, or the interruption of the heater and the exchanges of the heating elements and the thermocouples attached to the heating means 2 can not easily be performed. For this reason, as one example, it will be pointed out that the thermocouples extending outwardly of the heating means 2 and make-up lead wires connected to the thermocouples are connected to the heating furnace. This wiring or connection makes it difficult to easily exchange the heating means and the like elements of the hot-wall furnace 1.

Lead connections make it difficult to easily exchange the hot-wall furnace 1 in case of the troubles mentioned above. These conventional vacuum evaporating apparatus or methods are not suitable for the mass production of the evaporated thin film, this being a significant problem in the conventional technique.

SUMMARY OF THE INVENTION

An object of this invention is to eliminate problems and defects encountered in the prior technique in this field and to provide an vacuum evaporating apparatus capable of easily exchanging a newly invented hot-wall furnace of the apparatus.

Another object of this invention is to provide an evaporating apparatus capable of evaporating many kinds of metals, non-metals or compounds in an excellent manner for controlling the evaporating temperature and also capable of exchanging substrates without breaking the vacuum.

These and other objects can be achieved, according to this invention, by providing a vacuum evaporating apparatus for depositing thin films on a substrate comprising:

a vacuum tank;

a hot-wall furnaces disposed in the vacuum tank and adapted to heat and evaporate a material to be evaporated as an evaporation source;

an auxiliary vacuuming chamber connected to the vacuum tank;

a substrate exchanging mechanism for exchanging an evaporated substrate with a new substrate disposed in the vacuum tank through the auxiliary vacuuming chamber; and a substrate transferring means located to be rotatable above the hot-wall furnaces;

the hot-wall furnaces being provided with a plurality of crucibles coaxial in a vertical direction in which the evaporation source materials are accommodated, heaters independently provided for the crucibles, and thermocouples connected to the respective heaters to independently control the temperatures of the respective crucibles, the thermocouples being operatively connected to socket pins at a bottom of the hot-wall furnace and the heaters also being operatively connected to socket pins at the bottom of the hot-wall furnace.

In the preferred embodiment, the vacuum tank and the auxiliary vacuuming chamber are connected through a gate valve so as to effectively maintain the vacuum condition in the vacuum tank. The substrate transferring means comprises a turn table provided with a substrate heater. The socket pins are made of the same materials as those constituting metal portions of the respective thermocouples.

DESCRIPTION OF THE PREFERRED EMBODIMENTS

Figure 1:
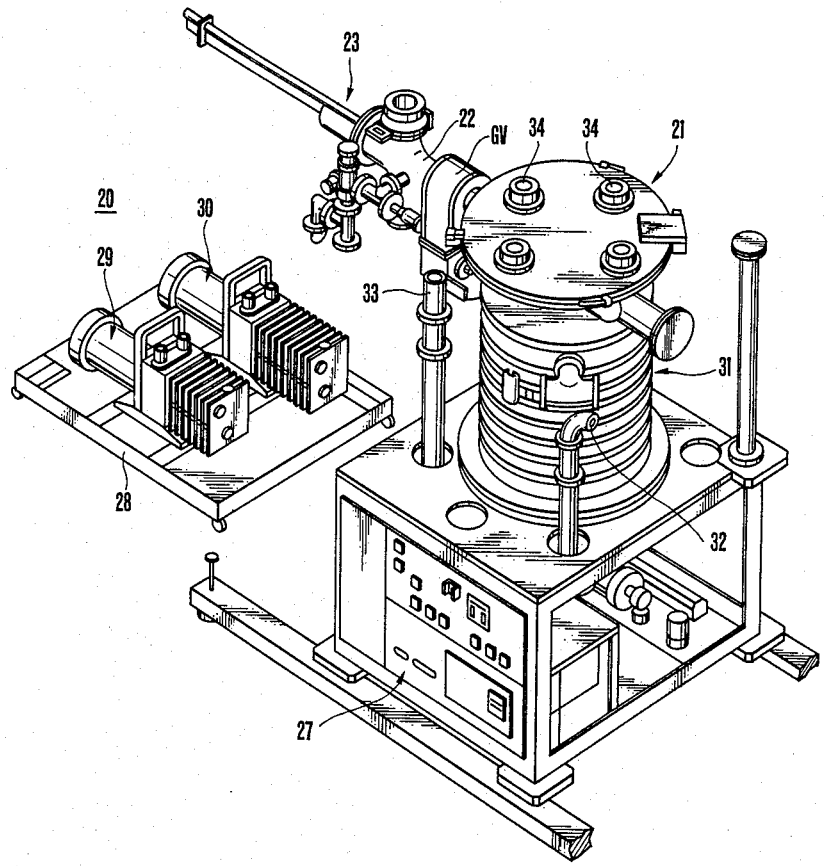
FIG. 1 is a perspective view of a vacuum evaporating apparatus of one embodiment according to this invention.

Referring to FIG. 1, a vacuum evaporating apparatus 20 according to this invention generally comprises a vacuum tank 21, an auxiliary vacuum chamber 22 operatively connected to the vacuum tank 21 through a gate valve GV, a substrate exchanging mechanism 23 which operates to take out a substrate (W) from the vacuum tank 21 and exchange a used substrate with a new substrate, hot-wall furnaces 54 (FIG. 2) located in the vacuum tank 21, a substrate transferring unit 25 (FIG. 2) for rotating the substrate W over the hot-wall furnaces 54, and a substrate heater 26.

A control panel 27 is located below the vacuum tank 21 for controlling the operations of an exhausting unit, heating unit and the like. An roughing pump 29 and a pre-pump 30 are mounted on a caster 28 which is shown as a separate unit in FIG. 1 on the side of the body of the vacuum evaporating apparatus 20. The roughing pump 29 and the pre-pump 30 consist of rotary pumps, for example. Around the vacuum tank 21 is disposed a water cooling pipe 31. Reference numerals 32 and 33 designate a liquid nitrogen intake tube and a liquid nitrogen discharge tube, respectively, and reference numeral 34 designates viewers.

Figure 2:
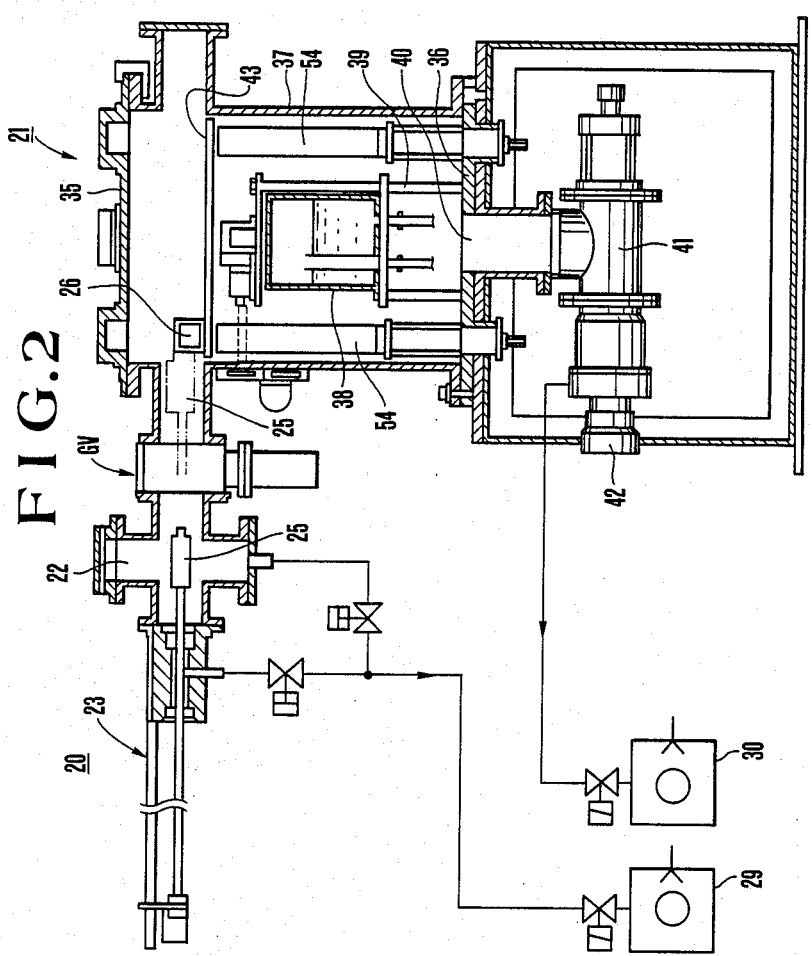
FIG. 2 is a cross-sectional view of a vacuum tank and associated units or mechanisms of the evaporating apparatus shown in FIG. 1.

As shown in FIG. 2, the vacuum tank 21 comprises a body 37 closed at both ends by upper and lower covers 35 and 36, and a plurality of (four in the illustrated embodiment) "hot-wall furnaces", described in detail hereinafter, which are disposed in the body 37 in standing state with lower ends supported by the lower cover 36.

The hot-wall furnaces 54 are arranged so as to surround a liquid nitrogen trap 38 by which liquid component or gas component in the vacuum tank 21 is condensed therearound to improve the vacuum degree in the tank 21.

The liquid nitrogen trap 38 is also supported at the end by the lower cover 36 through a support table 39, and the lower plate 36 is provided with a through hole 40 to which the pre-pump 30 is operatively connected through a valve 41 and a main pump 42. The main pump 42 consists of turbo-molecular pump, for example.

Figure 3:
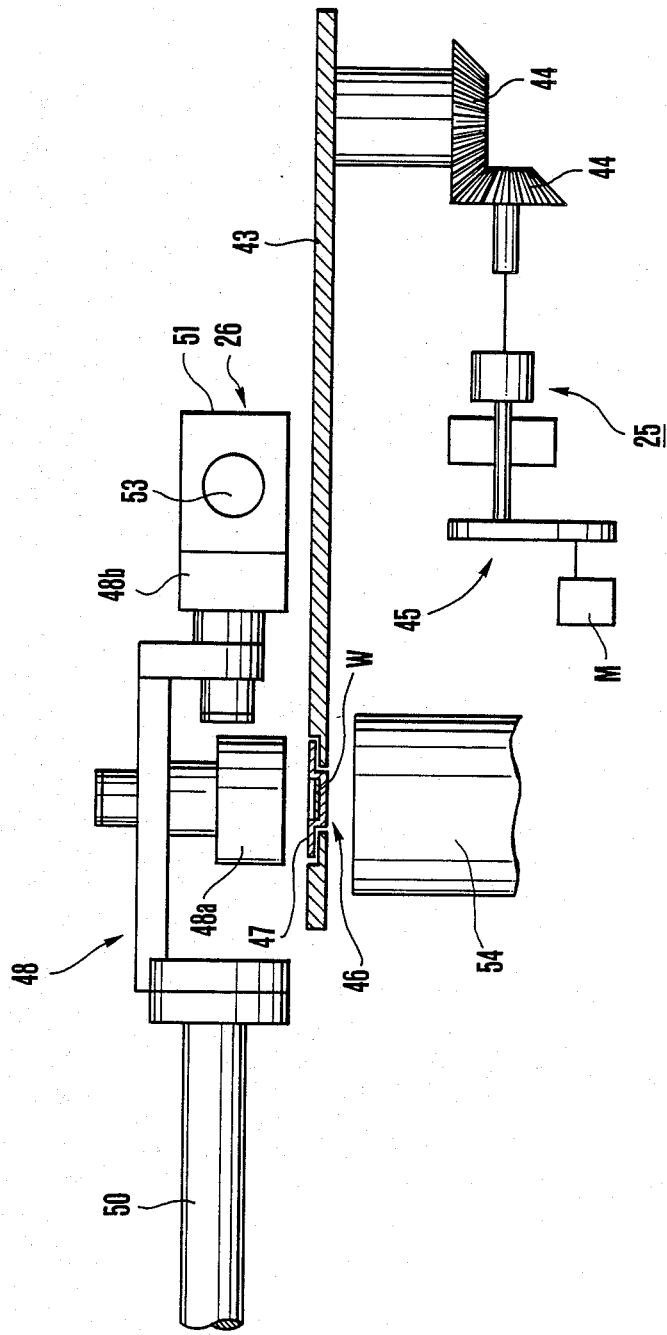
FIG. 3 is a cross-sectional view of a substrate exchanging mechanism of the apparatus shown in FIG. 1.

A turn table 43 is located above the liquid nitrogen trap 38, and as shown in FIG. 3, bevel gears 44, a planetary gear 45, and a pulse motor M are coupled to the turn table 43 to thereby constitute the substrate transferring unit 25 as a whole.

The turn table 43 is provided with a plurality of through holes 46 into which the substrate W supported by a frame 47 is fitted, the substrate W being by turns transferred above the heating device 24.

The substrate exchanging mechanism 23, the front portion of which is shown in detail in FIG. 3, includes an adsorbing device 48 operated by means of electromagnetic force, and the first adsorbing portion 48a of the adsorbing device 48 operates so as to adsorb the substrate W held by the frame 47 to separate the same therefrom and the second adsorbing portion 48b of the adsorbing device 48 operates to adsorb and separate the substrate heater 26. The adsorbing device 48 is supported by an arm 50 to be operated exterally from the vacuum tank 21 manually or electrically.

The substrate heater 26 comprises a case 51 and a heating lamp 53, and the substrate heater 26 serves to preliminarily heat the substrate W for effective vacuum evaporation thereof while rotating the substrate together with the turn table 43.

Figure 4:
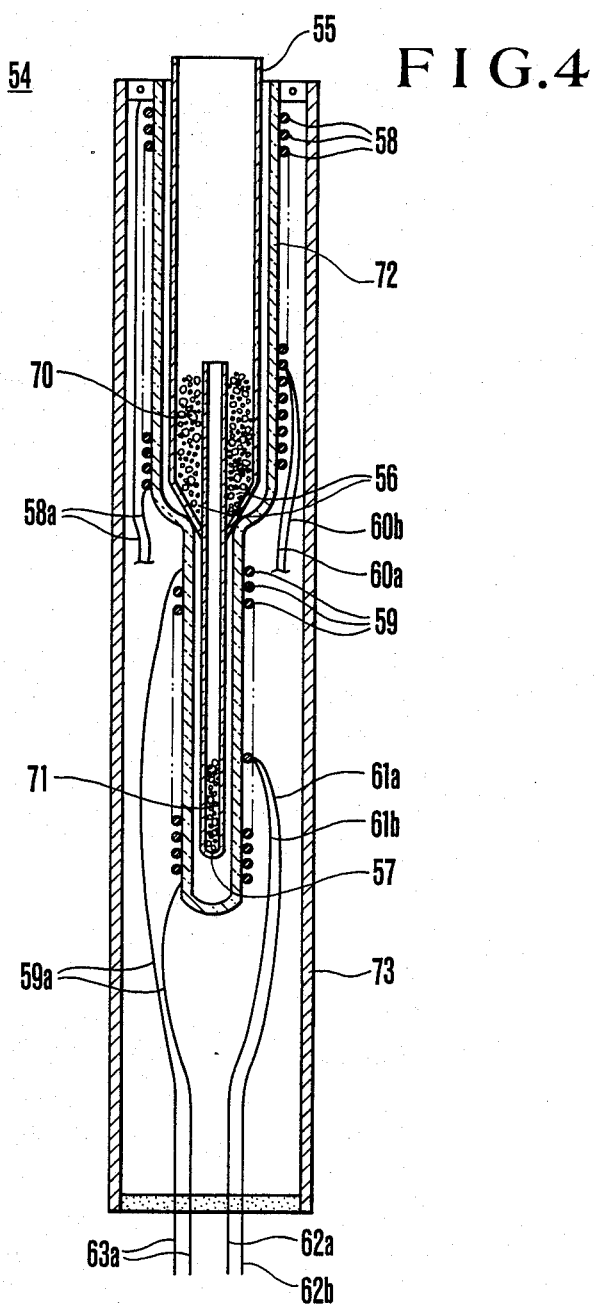
FIG. 4 is a vertical sectional view of a hot-wall furnace to be disposed in the vacuum tank of the vacuum evaporating apparattus.

In a preferred embodiment according to this invention, each of the hot-wall furnaces 54 are shown as in FIG. 4. A plurality of hot-wall furnaces, each preferrably having a cylindrical outer configuration, are vertically coaxially located in the vacuum tank 21 to be controllable, respectively independently.

The hot-wall furnace 54 comprises a holder 73, a heating means 72, and crucible vessel 55. Preferably the holder 73 is made of stainless tube or other heat-proof tubes. The holder may be made of tramsparent silica glass tube, transparent quartz glass tube, or other transparent or semitransparent tube. In this case, heat shields are required.

The holder 73 holds therein the heating means 72. The heating means holds therein the crucible vessel 55 interchangeably. The holder 73 shown in FIG. 4 has no aperture to seal therein, because of the protection of the heater 58 and 59. But the holder 73 may have apertures on its periphery to proceed to vacuuming degree therein, if the vapor pressure in the vacuum tank 21 is not so high.

The vessel 55 accommodates materials to be evaporated as evaporating source materials. The source crucible holder 55 comprises a first upper crucible 56 having a large diameter and a second lower crucible 57 which is continuously formed to the upper portion coaxially and has a diameter smaller than that of the upper portion 56 as shown in FIG. 4. The first upper and second lower crucibles 56 and 57 accommodate respectively the first and second evaporating source materials 70 and 71. The source materials 70 and 71 may be not only solid metals but also metal gases. If the source materials 70 and 71 are metal gases, the source materials 70 and 71 are supplied through supply pipes (not shown) extending outside of the vacuum tank 21. A first heater 58 (a coil heater illustrated with an enlarged scale in FIG. 4) is disposed around the outer peripheral surface of the upper crucible 56 of the heating means 72 to heat the crucible 56 to the predetermined temperature and a second heater 59 (also a coil heater illustrated with an enlarged scale in FIG. 4) is disposed around the outer peripheral surface of the lower portion 57 of the heating means 72 to heat the crucible 57 to the predetermined temperature. Preferably the first and second heaters 58 and 59 are made of tungsten coil heater. Preferably the holder 73 and the heating means or tube 72 are made of transparent silica glass tube or other heat-proof transparent or semitransparent tubes. Photons from the heaters 58 and 59 should arrive on the surface of a substrate (shown in FIG. 3) through the holder and the heating means or tube 72. Receiving the photons, more high purity and favorable crystallinity of the surface film on the substrate can be accomplished.

Electric lead conducting wires 58a and 59a are connected to the first and second heaters 58 and 59 respectively so as to independently control the heating temperatures of the heaters 58 and 59.

A first thermocouple consisting of two metal portions 60a and 60b is arranged in the interior of the tube member 54 near the central portion of the first crucible 56 to measure the temperature of the crucible 56, and a second thermocouple consisting of metal portions 61a and 61b is arranged in the interior of the tube member 54 near the central portion of the second crucible 57 to measure the temperature of the crucible 57.

The first and second thermocouples 60a, 60b and 61a, 61b are connected respectively to connecting socket pins made of the same materials as those of the corresponding thermocoples at the bottom of the hot-wall furnace 54, but in the illustrated embodiment shown in FIG. 4, only the socket pins 62a and 62b for the thermocouple 61a, 61b are shown. For instance, when the metal portions 61a and 61b constituting the second thermocouple are made of an Alumel wire and a Chromel wire, respectively, the connecting socket pin 62a to which the metal portion 61a of the thermocouple is made of the Alumel wire and hence the socket pin 62b to which the metal portion 61b of the thermocouple is made of the chromel wire. The same fact may be adopted to the first thermocouple.

The connecting socket pins 62a and 62b are connected to a temperature controller through make-up lead wires, not shown.

The first and second heaters 58 and 59 are connected to socket pins through lead wires 58a and 59a, respectively, but in the illustrated embodiment in FIG. 4, only the socket pins 63a for the second heater 59 are designated by reference numerals 63a. The socket pins 63a are in turn connected to an electric power source through lead wires, not shown.

Figure 5:
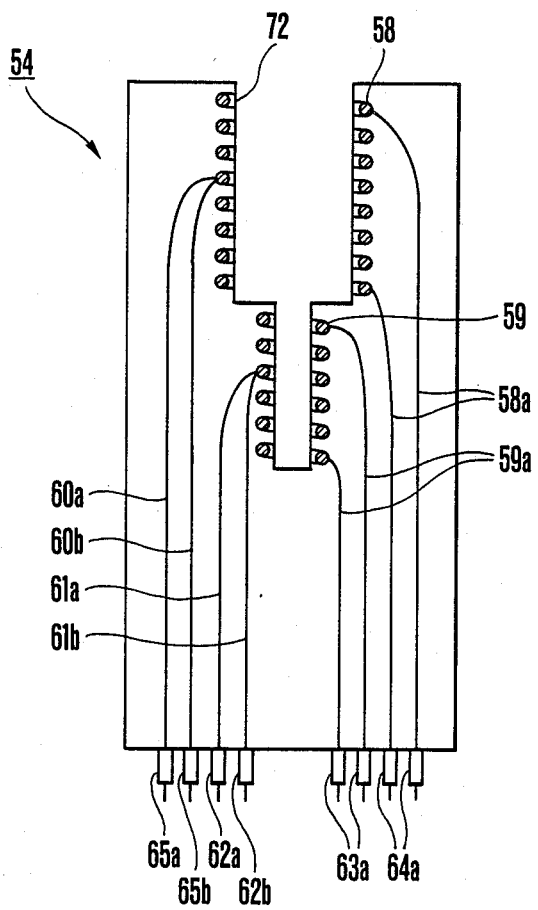
FIG. 5 is a schematic view of the hot-wall furnace shown in FIG. 4 for showing connection relationship between the constituting elements.
Figure 6:
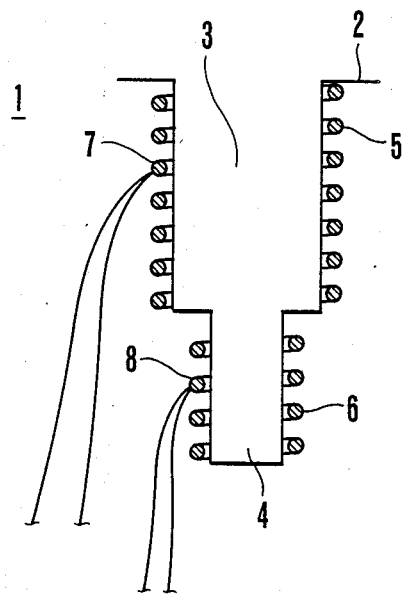
FIG. 6 is a schematic view of a conventional heating means to be located in the hot-wall furnace.
Figure 7:
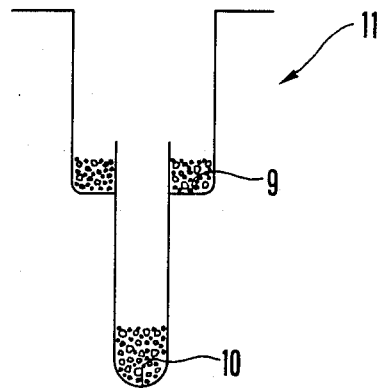
FIG. 7 is a schematic view of a crucible vessel, in which a evaporation source materials are accommodated, to be disposed in the hot-wall furnace.

The actual connections of the first and second thermocouples 60a, 60b and 61a, 61b to the socket pins 65a, 65b and 62a, 62b and of the first and second heaters 58 and 59 to the socket pins 64a and 63a at the bottom of the hot-wall furnace 54 are schematically shown in FIG. 5. This figure shows simplified heating means 72. Actually there are many possible heating connections. For example, the first heater 58 or the second heater 59 may comprise more than two heaters which are controllable respectively independently. Where the first heater 58 or the second heater 59 comprise more than two heaters, more precise evaporating control can be accomplished. In this case, thermocouples should be attached to each of the heaters.

The vacuum evaporating apparatus having the constructions described hereinbefore operates as follows.

The evaporating source materials are first set in the respective hot-wall furnace 54, which are thereafter placed in the predetermined positions in the vacuum tank 21, and under these conditions, the upper cover 35 is closed to envelop the vacuum tank 21.

The pre-pump 30 is then operated to create the vacuum condition in the vacuum tank 21, and in this operation, the vacuuming degree may be further enhanced by supplying the liquid nitrogen into the liquid nitrogen trap 38 thereby to condense mainly the water component and evaporated materials contained in the vacuum tank on the outer peripheral surface of the trap 38. The roughing pump 29 is also operated at this time to create the vacuum condition in the auxiliary vacuum chamber 22.

In the succeeding step, the substrate exchanging mechanism 23 is operated to attach the frame member 47, to which the substrate W is held, to the first adsorbing portion 48a and then to open the gate valve GV to introduce the same into the vacuum tank 21. The electric current to the first adsorbing portion 48a is interrupted and the frame member 47 with the substrate W is set into the through hole 46 of the turn table 43.

In the next step, the electric current is passed to the second adsorbing portion 48b to adsorb the substrate heater 26 consisting of the heating lamp 53 which is then placed on the frame member 47.

Subsequently, the stepping motor M is driven to operate the substrate transferring unit 25 so as to locate the substrate W in an accurate position directly above the tubular hot-wall furnaces 54. The evaporation source materials are heated by the first and second heaters 58 and 59 to evaporate and deposit the evaporated source on the substrate surface till the thickness of the evaporated film layer reaches the pre-determined value on the substrate W.

Subsequently, the turn table 43 is rotated to transfer the substrate W to the rest position between hot-wall furnaces, and the table 43 is stopped for a predetermined time. Then the turn table 43 is rotated to transfer the substrate W back to the former position directly above the hot-wall furnace 54, and is stopped for a predetermined time. The aforementioned rotation of the table 43 is repeated many times.

Therefore the substrate W is exposed alternately to evaporated gas and to the period of rest. This alternate exposure method is what is called the flip-flop method. By means of the flip-flop method, high purity and crystallinity of the film layer on the substrate W can be attained.

After the flip-flop action of the turn table, the turn table is rotated to transfer the substrate W to another station at which another type of evaporation source material is evaporated and deposited on the substrate W in substantially the same manner as that described hereinbefore. According to the embodiment, in which four hot-wall furnace 54 are disposed, four kinds of film can be evaporated and deposited on the substrate W.

In case of exchanging substrate, the gate valve GV is opened, and, according to the operation of the substrate exchanging mechanism 23, a new substrate W held by the first adsorbing portion 48a is transferred on the turn table 43.

After these operations, the gate valve GV is closed to interrupt the conductive connection between the auxiliary vacuum chamber 22 and the vacuum tank 21. The auxiliary vacuum chamber 22 is then opened to take out the vacuum evaporated substrate W and exchange with a new substrate to mount the same to the first adsorbing portion 48a.

The roughing pump 29 is driven immediately after the mounting of the new substrate W to pump up the air in the auxiliary vacuum chamber 22.

As described hereinabove, according to the vacuum evaporating apparatus of this invention, substrates can be exchanged while maintaining the substantial vacuum condition in the vacuum tank, so that the whole evaporation operations can be smoothly carried out with improved high efficiency.

In addition, the hot-wall furnace 54 used for the evaporating apparatus referred to hereinabove is provided with the first and second thermocouples 60a, 60b and 61a, 61b respectively for measuring the temperatures of the first and second recessed portions 56 and 57 and with the connecting socket pins made of the same materials as those of the corresponding thermocouples to be connected to the socket pins, so that the temperatures of the respective crucibles can be exactly observed, and accordingly, the temperatures of the respective portions can be accurately controlled.

The connections of the thermocouples 60a, 60b and 61a, 61b and the electric current conducting wires 58a and 59a to the socket pins 63a and 64a makes it possible to easily exchange these members or elements in case the wall surface of the hot-wall furnace 54 is extremely contaminated, the heater is interrupted, or the evaporation source materials are to be exchanged.

In this manner, the thin films, two or more kinds, can be effectively evaporated and deposited on the substrate by use of the evaporating apparatus of this invention.

According to this invention, an evaporating apparatus is equipped with hot-wall furnaces constituting a heaters, which is operatively connected to socket pins of sockets made of the same materials as those of thermocouples, so that the exchange of the hot-wall furnaces can be extremely easily performed, and accordingly, a thin film made of more than one kinds of metals, non-metals or compounds can be effectively formed on a substrate. The temperatures of materials to be evaporated as evaporation source materials can be accurately controlled.

Furthermore, since a plurality of hot-wall furnaces are located in the vacuum tank and substrates are subsequently transferred above the plural hot-wall furnaces, a plurality of evaporation source materials can be effectively evaporated, and moreover, during these evaporating steps, the substrates can be heated to the desired temperature, so that the improved vapor deposition can be achieved.

What is claimed is

1. A vacuum evaporating apparatus for depositing thin films on a substrate comprising:
    (a) a vacuum tank;
    (b) a plurality of hot-wall furnaces disposed in said vacuum tank for heating and evaporating a plurality of evaporation source materials for depositing as a thin film on a substrate, each one of said plurality of hot-wall furnaces including:
        (1) an interchangeable substantially vertical crucible vessel for holding an evaporation source material, said crucible vessel being a heat-resistant transparent or semitransparent tube, said crucible vessel having a plurality of coaxial vertically spaced subcrucibles for holding a plurality of evaporation source materials;
        (2) a heating tube mating with and detachably holding said interchangeable crucible vessel, and said heating tube being a heat-resistant transparent or semi-transparent tube;
        (3) a plurality of heaters, each one of said plurality of heaters substantially surrounding a portion of the outer peripheral surface of said heating tube and adjacent to a respective one of said plurality of subcrucibles for heating thereof;
        (4) a first electrical connecting pin attached to each one of said plurality of heaters;
        (5) a plurality of thermocouples, each one of said plurality of thermocouples being adjacent to one of sail plurality of heaters for independently operating each one thereof for independently controlling the temperature of each one of said plurality of subcrucibles;
        (6) a second electrical connecting pin attached to each one of said plurality of thermocouples;
        (7) a first plurality of electrical connecting pin-receiving means in the bottom of each said hot-wall furnace for detachably receiving each said first electrical connecting pin; and
        (8) a second plurality of electrical connecting pin-receiving means in the bottom of each said hot-wall furnace for detachably receiving each said second eletrical connecting pin;
    (c) a turn table rotatably attached to said vacuum tank, said turn table being inside said vacuum tank and vertically spaced above said plurality of hot-wall furnaces, means on said turn table for releasably holding a plurality of substrates above said plurality of hot-wall furnaces for having thin films of evaporation source materials deposited on a plurality of substrates thereby, substrate heating means on said turn table for preliminarily heating a plurality of substrates for preparing a plurality of substrates to have a thin film deposited thereon by said plurality of hot-wall furnaces, and means attached to said turntable for non-continuously rotating said turn table for non-continuously moving one of a plurality of substrates held by said turn table from a depositing position directly above one of said plurality of hot-wall furnaces to a rest position between adjacent ones of said plurality of hot-wall furnaces for controlling the depositing of a thin film on a plurality of substrates;
    (d) an auxiliary vacuum chamber fluidly connected to said vacuum tank; and
    (e) a substrate exchanging means adjacent to said auxiliary vacuum chambers for exchanging a new substrate for a substrate having a thin film deposited thereon releasably held by said turn table through said auxiliary vacuum chamber.

2. An apparatus as in claim 1, further comprising a gate valve fluidly connected to said chamber, said gate valve having means for maintaining a vacuum in said vacuum tank during the exchanging of a substrate by said substrate exchanging means.

3. An apparatus as in claim 1, wherein said second plurality of electrical connecting pins for said plurality of thermocouples is of the same material as the material of a metal portion of said plurality of thermocouples.

4. An apparatus as in claim 1, wherein each said plurality of heaters is a tungsten coil heater.

* * * * *